United States Patent
Callahan (10) Patent No.: US 6,355,980 B1
(45) Date of Patent: Mar. 12, 2002

(54) DUAL DIE MEMORY

(75) Inventor: John M. Callahan, San Ramon, CA (US)

(73) Assignee: Nanoamp Solutions Inc., San Jose, CA (US)

(*) Notice: Subject to any disclaimer, the term of this patent is extended or adjusted under 35 U.S.C. 154(b) by 0 days.

(21) Appl. No.: 09/354,288

(22) Filed: Jul. 15, 1999

(51) Int. Cl.$^7$ .......................... H01L 23/48; H01L 23/52; H01L 29/40
(52) U.S. Cl. ........................ 257/734; 257/686; 257/777
(58) Field of Search ................................. 257/734, 723, 257/686, 777, 778, 784

(56) References Cited

U.S. PATENT DOCUMENTS 5,949,139 A * 9/1999 Imura et al. ................. 257/686
6,118,184 A * 9/2000 Ishio et al. .................. 257/787

FOREIGN PATENT DOCUMENTS

JP     05-315540    * 11/1993

* cited by examiner

Primary Examiner—Phat Xuan Cao
(74) Attorney, Agent, or Firm—Patrick T. King (57) ABSTRACT

A double-sized chip assembly and method is provided for two back-to-back integrated-circuit chips which both have the same fabrication mask sets. An electrically-selectable bonding-pad connection option alternatively provides a standard, non-reversed, option NRO for a bonding-pad layout and a non-standard, reversed option RO for the layout of the bonding-pads. The double-sized, back-to-back, wire-bonded integrated-circuit chip assembly and method includes a pair of integrated-circuit chips, each having one or more reversible wire-bonding-pads. One of the chips has its wire-bonding-pads electrically reversed such that the wire-bonding pads on both chips are located near each other to accommodate wire-bonding to a common bonding finger of a lead frame. A bonding-option wire-bonding-pad has an external voltage applied to it to indicate whether the integrated-circuit chip is to provide a standard pattern for the reversible wire-bonding-pads, or a reversed pattern for the reversible wire-bonding-pads. A voltage sensor circuit senses the voltage applied to the bonding-option wire-bonding-pad and alternatively generates either a standard NRO gate control signal or a non-standard, reversed RO gate control signal from the voltage state of the bonding-option wire-bonding-pad.

14 Claims, 6 Drawing Sheets

DUAL DIE MEMORY

BACKGROUND OF THE INVENTION

1. Field of the Invention

This invention relates to packages for integrated-circuits and, more particularly, to an integrated-circuit package which contains two similar integrated-circuit chips positioned back-to-back to increase the capacity of the package.

2. Prior Art

A typical integrated-circuit chip has bonding-pads located around its edges. To connect each bonding-pad to an exterior package pin, a lead frame has bonding fingers, the ends of which are located adjacent to the bonding-pads of the chip and which are connected to external package leads or pins. To connect the bonding-pads on the integrated-circuit chip to the bonding fingers of the lead frame, short, thin bonding wires are connected, or wire-bonded, between each bonding-pad and an adjacent bonding finger. It should be understood that, when the same chips with identical wire-bonding-pads are placed back-to-back in a package, the bonding-pads of one of the chips are reversed with respect to the bonding fingers on the lead frame. However, for an integrated-circuit package with back-to-back chips, it is a requirement that certain external package pins and their corresponding bonding fingers be shared in common. This is difficult to obtain because, in order to connect the reversed bonding-pads to the common bonding fingers of a lead frame, certain bonding wires would have to extend across the chip to reach corresponding reversed bonding-pads on the opposite side of the chip. These thin bonding wires would be very long and consequently subject to a number of problems, including, for example, shorting and wire wash as the chips are encapsulated with a viscous encapsulation material.

To increase the capacity of an integrated-circuit package, two integrated-circuit chips, or chips, can be placed back-to-back. For example, the storage capacity of a memory type of integrated-circuit package can be doubled by using two of the same memory chips in a common package. Certain address pins, output pins, and power pins are common to both chips and can be tied together.

The same integrated-circuit chip cannot be used in a back-to-back package configuration. In a back-to-back configuration, the chips are reversed with respect to each other and same chip pads cannot be connected the same bonding fingers and package pins. As a consequence, if two back-to-back chips are to be used in a package, one of the chips must have a reversed bonding-pads layout. This requires that two different mask sets be used to fabricate two different integrated-circuit chips with different bonding-pad layouts. As the line widths for integrated-circuit processes get smaller and smaller, the corresponding mask sets are significantly increasing in cost, so that having two different mask sets for a back-to-back package of similar integrated-circuits is an expensive undertaking.

What is needed is a cost-effective technique for providing integrated-circuit packages with back-to-back chips which can share common package pins.

SUMMARY OF THE INVENTION

It is therefore an object of the invention to provide a cost-effective technique for providing an integrated-circuit chip assembly which has back-to-back chips which are adapted to share common package pins and which are fabricated with the same masks.

In accordance with this and other objects of the invention, a double-sized chip assembly for two back-to-back integrated-circuit chips is provided with a single integrated-circuit layout and a single mask sets. This is accomplished by providing an electrically selectable bonding-pad connection option which provides for a first bonding-pad layout and a second bonding-pad option. One option provides a standard bonding-pad layout and the other option provides a reversed bonding-pad layout.

A double-sized, back-to-back, wire-bonded integrated-circuit chip assembly and method includes a pair of integrated-circuit chips, each having one or more reversible wire-bonding-pads. The chips are adapted to be centrally mounted back-to-back within a lead frame having inwardly-extending bonding fingers. One of the chips has its wire-bonding-pads electrically reversed such that the pads for similar functions are located near each other for wire-bonding to a common bonding finger of a lead frame.

A bonding-option wire-bonding-pad has an external voltage applied to it to indicate whether the integrated-circuit chip is to provide a standard pattern for the reversible wire-bonding-pads, or a reversed option RO pattern for the reversible wire-bonding-pads. A- voltage sensor circuit senses the voltage applied to the bonding-option wire-bonding-pad and alternatively generates either a standard NRO gate control signal or a non-standard, reversed RO gate control signal from the voltage state of the bonding-option wire-bonding-pad.

Two or more bonding-option wire-bonding-pads and voltage sensor circuits generate various bonding option logic signals. A logic circuit generates standard NRO and non-standard, reversed RO gate control signals from the one or more bonding option logic signals.

The gate circuits include a complementary-transistor output amplifier.

A double-sized, back-to-back, wire-bonded integrated-circuit chip assembly uses identical chips which are fabricated with the same mask sets. When mounted back-to-back, one of the pair of identical chips has some of its wire-bonding pads reversed to provide connections to commonly used bonding fingers of a lead frame.

An integrated-circuit chip is provided with one or more pairs of reversible wire-bonding-pads to alternatively provide either a standard pattern for the reversible wire-bonding-pads or a non-standard, reversed wire-bonding pattern for the reversible wire-bonding-pads. The chip includes a first wire-bonding-pad and a second wire-bonding-pad. First and second common signal lines are provided on the integrated-circuit chip. Two gate circuits are provided for each wire-bonding-pad. An output signal terminal of each gate circuit is connected to either a first or a second common signal line. A standard wire-bonding configuration control NRO signal operates one of the gate circuits on each wire-bonding pad to provide a standard pattern for the first wire-bonding-pads,. The standard pattern connects one of the wire-bonding-pad to a first common signal line and the second wire-bonding pad to a second wire-bonding pad.

A non-standard, reversed wire-bonding configuration control RO signal operates the other gate circuits on each wire-bonding pad gate circuit to alternatively provide a non-standard, reversed pattern for the wire-bonding-pads.

The NRO signal provides a predetermined standard bonding-pad configuration for the integrated-circuit chip and the RO signal provides a predetermined alternative reversed bonding-pad configuration for the integrated-circuit chip.

A plurality of pairs of first and second wire-bonding-pads can be switched to respective pairs of common signal lines.

A bonding-option wire-bonding-pad is used to program the connections to the bonding-wire pads prior to encapsulation of the chips. A voltage sensor circuit senses the voltage applied to the bonding-option wire-bonding-pad and alternatively generates either a standard NRO gate control signal or a non-standard, reversed RO gate control signal from the voltage state of the bonding-option wire-bonding-pad.

Two or more bonding-option wire-bonding-pads are used for a number of control options, two of which are the NRO and the RO options. Corresponding voltage sensor circuits are provided for respectively sensing the voltage applied to the respective bonding-option wire-bonding-pads. A bonding option logic signal array generates one or more bonding option logic signals and a logic circuit generates standard NRO and non-standard, reversed RO gate control signals from the one or more bonding option logic signals.

One specific embodiment of the invention includes three bonding-option wire-bonding-pads each of which are adapted to having an external voltage applied thereto such that the logic circuit for generating standard NRO and non-standard, reversed RO gate control signals generates the standard NRO and non-standard, reversed RO gate control signals.

The gate circuits include a logic circuit which has a first signal input terminal connected to one of the wire-bonding-pads, which has a second control signal input terminal for receiving a wire-bonding configuration control signal to operate the gate circuit, and which has an output terminal coupled to one of the common signal lines. The gate circuits include a chip enable input terminal for receiving a chip enable signal CE to activate the gate circuits In one embodiment of the invention, the logic circuit, a first logic gate has an input terminal connected to a first signal input terminal, a second input terminal connected to the second control signal input terminal, and an output terminal connected to an input terminal of the output driver circuit. The logic circuit also includes a second logic gate, having an input terminal connected through an inverter to the first signal input terminal, having a second input terminal connected through an inverter to the second control signal input terminal, and having an output terminal connected to an input terminal of the output driver circuit. The first logic gate includes a NAND gate and the second logic gate includes a NOR gate. The first logic gate has an input terminal for receiving a chip enable signal CE and the second logic gate has an input terminal for receiving an inverted chip enable signal.

The logic circuit includes an output driver circuit having an input terminal and having an output terminal connected to one of the common signal lines. The output driver circuit includes a complementary-transistor output amplifier which includes a p-channel transistor having a gate terminal connected to an output terminal of the NAND gate and a N-channel transistor connected to an output terminal of the NOR gate.

When the integrated-chips are mounted back-to-back, it is necessary that the wire-bonding-pads for external control signals such as chip-select, write enable, clock, etc., be reversed in accordance with the present invention. Other signals such as memory address and data I/O wire-bonding pads do not absolutely need their wire-bonding pads to be reversed if the pairs of bonding-pads are the same type, that is, address pads or Data input/output I/O pads. Even though one of the chips may have its addresses scrambled, each scrambled address still accesses a uniquely defined memory cell for storing and retrieving I/O signal bits. The memory is unscrambled when the data in the memory cells is addressed and read out using the scrambled address bits. Therefore, reversal of the pads in a pair of pads is not required for control signals as long as the pairs of non-reversed bonding-pads are the same type, that is, in the same family of signals, such as address signals or data I/O signals.

BRIEF DESCRIPTION OF THE DRAWINGS

The accompanying drawings, which are incorporated in and form a part of this specification, illustrate an embodiment of the invention and, together with the description, serve to explain the principles of the invention.

DETAILED DESCRIPTION OF THE PREFERRED EMBODIMENTS

Reference will now be made in detail to a preferred embodiment of the invention, an example of which is illustrated in the accompanying drawings. While the invention will be described in conjunction with the preferred embodiment, it will be understood that is not intended to limit the invention to this embodiment. On the contrary, the invention is intended to cover alternatives, modifications and equivalents, which may be included within the spirit and scope of the invention as defined by the appended claims.

Figure 1A:
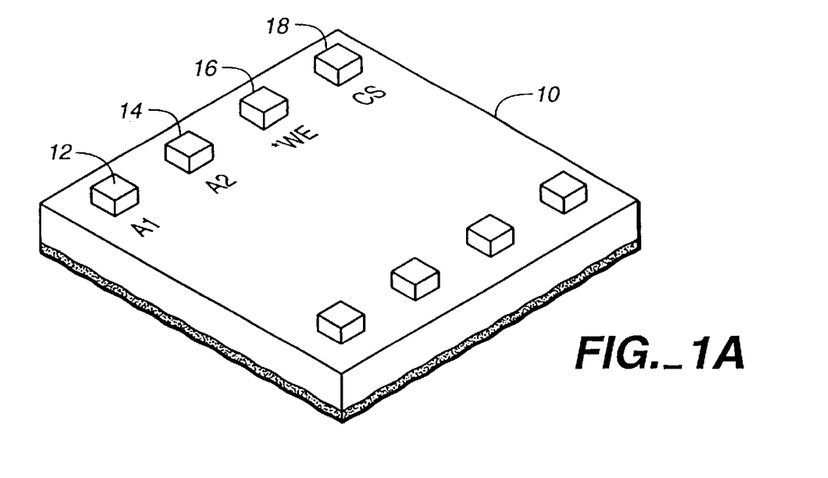
FIG. 1A is an isometric view of a typical integrated-circuit chip, or chip.

FIG. 1A shows a simplified representation of a typical integrated-circuit chip, or chip, 10, formed as a thin layer of silicon with various materials deposited thereupon to form an integrated-circuit. Near the edge of the chip 10 are formed a number of typical wire-bonding-pads 12, 14, 16, 18, which are respectively provided for an address bit signal A1, an address bit signal A2, an inverted write-enable *WE signal, and a chip select signal CS. The chip 10 is typically packaged by connecting one of the respective wire-bonding-pads to an inwardly extending bonding finger of a lead frame with wire-bond wires (not shown). The bonding fingers are connected to the external leads or pins of a package so that various points on the chip 10 are externally accessible.

Figure 1B:
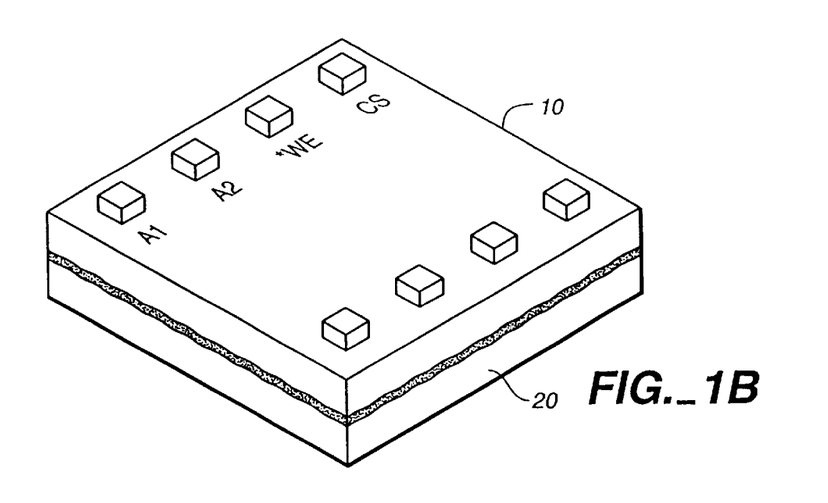
FIG. 1B is an isometric view of two typical integrated-circuit chips mounted in a back-to-back configuration.
Figure 1C:
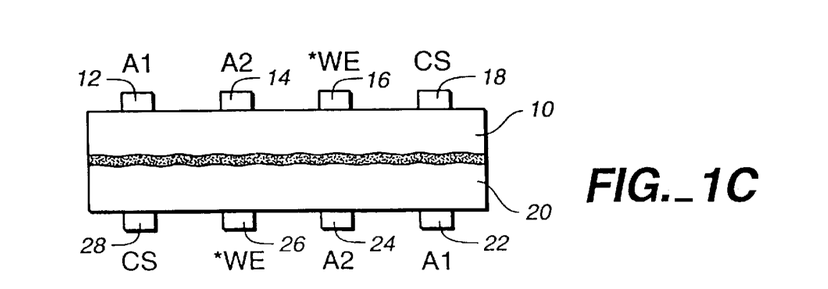
FIG. 1C is an end view of two typical integrated-circuit chips mounted in a back-to-back configuration showing reversal of the bonding-pads of the lower chip.

FIGS. 1B and 1C show a simplified representation of a back-to-back assembly of the chip 10 to another identical chip 20 to provide, for example, a double-sized memory chip. The identical lower chip 20 also has number of wire-bonding-pads 22, 24, 26, 28, which are also respectively provided also for an address bit signal A1, an address bit signal A2, an inverted write-enable *WE signal, and a chip select signal CS. Because the chips 10, 20 are identical, the bonding-pads of the lower chip 20 are reversed with respect to the upper chip 10.

In order to package back-to-back chips, such as memory chips with address terminals and control terminals such as write enable and chip select, it is required, for example, that the address bonding-pads be in close proximity to a common bonding finger and that the address bonding-pads be connected in common with a common bonding finger. As mentioned in the background of this invention, this presents difficulties because the bonding-pads on the lower chip are reversed which would require that certain bonding wires would have to extend across the lower chip 20 to reach corresponding bonding fingers for the upper chip 10. These thin bonding wires would be very long and consequently subject to shorting and wire wash as the chips are encapsulated with a viscous encapsulation material. Consequently, it is required that one of the back-to-back chips have a reversed pattern for its bonding-pads to allow short bonding wires to be used.

Figure 2:
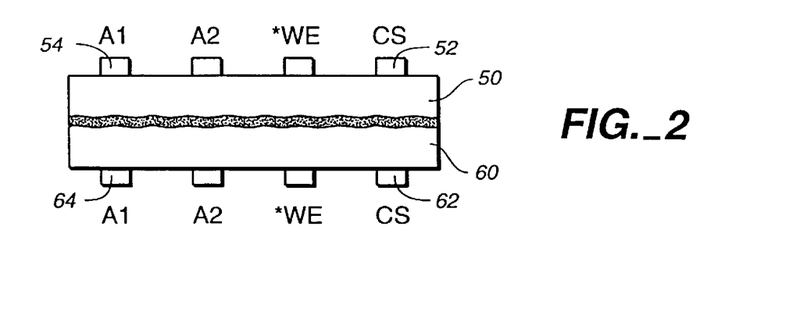
FIG. 2 is an end view of two integrated-circuit chips provided according to the invention and mounted in a back-to-back configuration showing alignment of the bonding-pads of the lower chip with the bonding-pads of the upper chip.

FIG. 2 shows an upper chip 50 and a lower chip 60 with like bonding-pads located near each other. This ordinarily would require that one of the chips have a reversed bonding-pad layout, which traditionally require a separate, reversed mask set for fabrication of the reversed chip. Reversal of the bonding-pad layout for the reversed one of these chips is accomplished according to the present invention without having to have two separate mask sets. According to the present invention, an upper chip 50 is provided with reversible pairs of wire-bonding-pads, typically shown as 52, 54. A lower chip 60 is also provided with a reversible pair of wire-bonding-pads, typically shown as 62, 64. The chips 50, 60 are thus adapted to be mounted in a back-to-back configuration as shown, where one set of bonding-pads is reversed with respect to the other set.

For example, in this Figure., the typical pair of wire-bonding-pads 52, 54 for the upper chip 50 are configured to provide a standard, that is, non-reversed option NRO for the pattern of the bonding-pads, while the wire-bonding-pads 62, 64 for the lower chip 60 are configured to provide a non-standard, reversed option RO for the bonding-pad. For a standard wire-bonding-pad configuration on the upper chip 50, the pad 52 is set to be a chip-select CS pad and the pad 54 is set to be an A1 address bit pad. For a non-standard, reversed wire-bonding-pad configuration on the lower chip 60, the pad 62 is reversed to be a chip-select CS pad and the pad 64 is set to be an A1 address bit pad. Thus the chip-select pads and address pads for a NRO chip and a RO are provided in close proximity for attachment with bonding wires to the same bonding finger of a lead frame.

Figure 3:
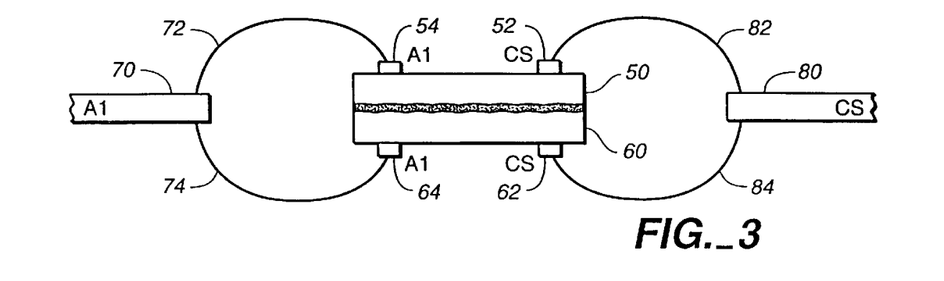
FIG. 3 is a side view showing two bonding wires connected from a common lead frame bonding finger to each one of two aligned bonding-pads of two back-to-back chips provided according to the invention.

FIG. 3 illustrates connection of the A1 wire-bonding-pad 54 on the 5 chip 50 to a nearby A1 bonding finger 70 of a lead frame with a bonding wire 72. The A1 wire-bonding-pad 64 on the chip 60 is connected to the A1 bonding finger 70 of the lead frame with the bonding wire 74. Similarly, the CS bonding-pads 52, 62 are connected to a nearby bonding finger. This FIG. also illustrates connection of the CS wire-bonding-pad 52 on the chip 50 to a nearby CS bonding finger 80 of the lead frame with a bonding wire 82. The CS wire-bonding-pad 62 on the chip 60 is connected to the CS bonding finger 80 of the lead frame with the bonding wire 84.

The A1 bonding-pad and the CS bonding-pad on each of the chips are reversible. Note that only the bonding-pads on one of the chips are reversed to match the bonding-pads on the other chip having a standard, or non-reversed, bonding-pad configuration. Also note that reversible pairs of bonding-pads are only needed for signals which control the chips. Using reversible pairs of bonding-pads is not absolutely required, for example, for memory chips, if the pairs of bonding-pads are the same type, that is, address pads or Data input/output I/O pads. This is true because the upper chip and the lower chip are alternately used. Even though one of the chips has its addresses and data scrambled, each scrambled address still accesses a uniquely defined memory cell for storing and retrieving I/O signal bits. The memory is unscrambled when the data in the memory cells is addressed and read out using the scrambled address bits. Therefore, reversal of the pads in a pair of pads is only required for control signals as long as the pairs of non-reversed bonding-pads are in the same family of signals, such as address signals or data I/O signals, such that data stored in a scrambled fashion can be unscrambled. Note that the VCC and VSS pads (power pads) are built in the center of the chip edges, so that when the chips are back to back, the power pads still line up. VCC is on the top edge and VSS is on the bottom edge.

Figure 4:
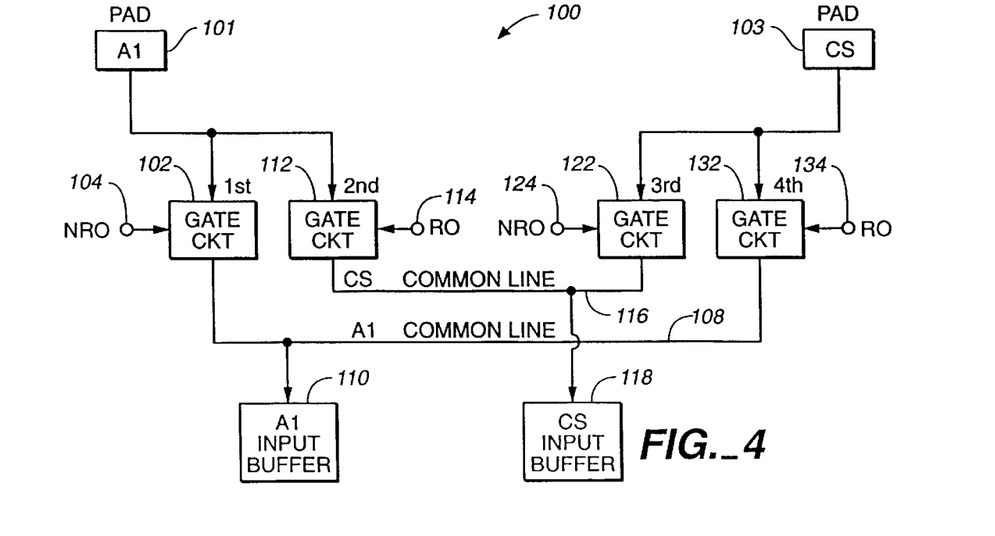
FIG. 4 is a block diagram of a circuits which provides reversible connections between two input pads and two input buffers according to the invention.

FIG. 4 shows gating circuitry 100 for use with a pair of wire-bonding-pads on an integrated-circuit chip. The gating circuitry 100 uses four gate circuits to provide two optional wire-bonding-pad patterns for a pair of wire-bonding-pads 101, 103 on the chip. The wire-bonding patterns include a standard, non-reversed pattern option NRO and, alternatively, a non-standard, reversed pattern RO pattern wire-bonding pattern for the pair of wire-bonding-pads 101, 103 on the chip.

The gating circuitry 100 includes a first gate circuit 102 which is controlled by a NRO control signal at a control terminal 104 to connect the first wire-bonding-pad 101 to a first common signal line 108 in a standard, non-reversed NRO configuration. The first common signal line 108 is connected to the input terminal of an A1 input signal buffer 110. The gating circuitry 100 includes a second gate circuit 112 which is controlled by a RO control signal at a control terminal 114 to optionally connect the first wire-bonding-pad 101 to a second common signal line 116 in a reversed RO configuration. The second common signal line 116 is connected to an input terminal of a CS input signal buffer 118.

The gating circuitry 100 includes a third gate circuit 122 which is controlled by the NRO control signal at a control terminal 124 to connect the second wire-bonding-pad 103 to the second common signal line 116 in a standard, non-reversed NRO configuration. The gating circuitry 100 includes a fourth gate circuit 132 which is controlled by the RO control signal at a control terminal 134 to optionally connect the second wire-bonding-pad 103 to the first common signal line 108 in a reversed RO configuration.

In operation, the standard, non-reversed NRO signals operate the gate circuits 102, 122 to connect the first wire-bonding-pad 101 to the input buffer 110 and to connect the second wire-bonding-pad the input buffer 118. Alternatively, the non-standard reversed RO signals operate the gate circuits 112, 132 to connect the first wire-bonding-pad 101 to the input buffer 118 and to connect the second wire-bonding-pad 103 to the input buffer 110.

Figure 5:
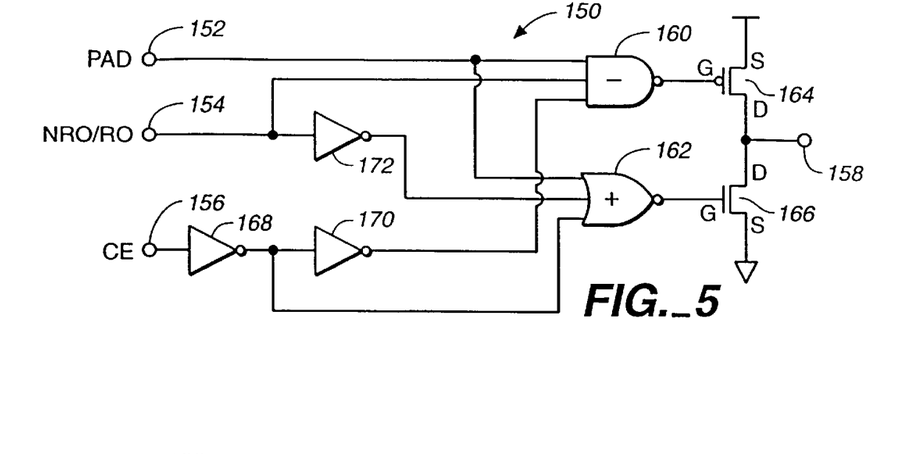
FIG. 5 is a logic circuit diagram showing a gate circuit which provides a selectable connection between a bonding-pad and one of two common signal lines.

FIG. 5 illustrates an embodiment of a typical gate circuit 150 which is used for the gate circuits 102, 112, 122, and 132 of FIG. 4. A pad input terminal 152 is connected to a wire-bonding-pad on a chip. An NRO/RO control input terminal 154 receives either a NRO or a RO control signal for the gate circuit. A CE terminal 156 receives a Chip Enable CE signal. An output terminal 158 is connected through one of the common signal lines to an input terminal of an input buffer circuit such as illustrated in FIG. 4.

The gate circuit 150 includes a three-input NAND gate 160 and a three-input NOR gate 162, the output terminals of which are connected, respectively, to a gate terminal of a PMOS transistor 164 and to a gate terminals of a NMOS transistor 166. The drain terminals of the transistors 164, 166 are connected to the output terminal 158. The source terminals of the transistors 164, 166 are respectively connected to VCC and VSS, or ground.

The pad input terminal 152 is connected to a first input terminal of the NAND gate 160. The NRO/RO terminal 154 is connected to a second input terminal of the NAND gate 160. The CE terminal 156 is connected through a pair of inverters 168, 170 to a third input terminal of the NAND gate 160. The output terminal of the NAND gate 160 goes to a LOW level only when all three of the input signals (pad signal, NRO/RO, CE) at terminals 152, 154, 156 are simultaneously at HIGH levels.

The pad input terminal 152 is connected to a first input terminal of the NOR gate 162. The NRO/RO terminal 154 is connected through an inverter 172 to a second input terminal of the NOR gate 162. The CE terminal 156 is connected through the one inverter 168 to a third input terminal of the NOR gate 162. The output terminal of the NOR gate 162 goes to a HIGH level only when all three of the input signals (pad signal, NRO/RO, CE) at terminals 152, 154, 156 are simultaneously at HIGH levels. The output terminal of the NOR gate 162 otherwise is at a LOW level when all three of the input signals (pad signal, NRO/RO, CE) at terminals 152, 154, 156 are not simultaneously at HIGH levels.

The voltage at the output terminal 158 goes to a HIGH level only when the output terminal of the three-input NAND gate 160 is at a LOW level and when the output terminal of the three-input NOR gate is at a HIGH level.

Note that if the NRO/RO signal is at a LOW level, the pad voltage is not transmitted to the output terminal 158 and to one of the common lines 108, 116 of FIG. 4. If the NRO/RO signal is at a HIGH level, the pad voltage is transmitted to the output terminal 158 and to one of the common lines 108, 116 of FIG. 4.

Figure 6:
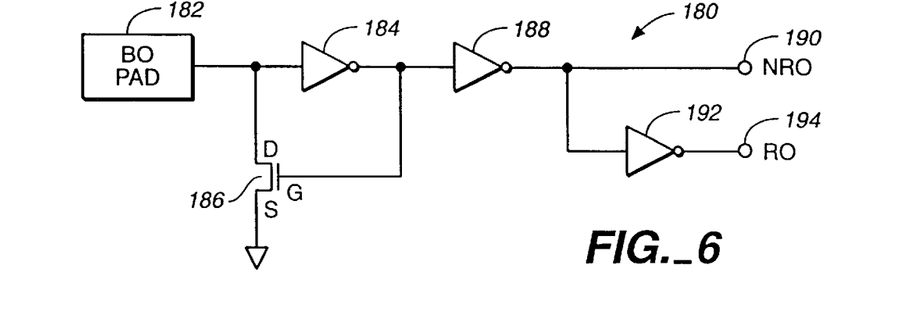
FIG. 6 is a logic diagram for a bonding-pad voltage sensor circuit which provides a standard NRO control signal for the gating circuit of FIG. 5 and which provides a reverse RO control signal for the gating circuit of FIG. 5.

The NRO or RO bonding-pad options are set prior to encapsulation of a chip in a package by using separate wire-bonding-pads to select either the NRO or the RO option for pairs of bonding-pads for a chip. FIG. 6 is a logic diagram for a voltage sensor circuit 180 which senses the voltage on a single bonding-option pad 182 to provide one of two mutually exclusive configuration options for the gate circuits 102, 112, 122, 132. One bonding-pad option for the bonding-option pad provides a standard, non-reversed bonding-pad option NRO for selected pairs of bonding terminals on the chip. The other bonding-pad option provides a non-standard, reversed bonding-pad option RO for the selected pairs of bonding terminals. The NRO option standard bonding-pads) is selected by using a bonding wire to connect the bonding-option pad 182 to a VCC voltage source. The RO option (reversed bonding-pads) is selected by not connecting a bonding wire to the bonding option pad 182.

The voltage sensor circuit 180 controls the states of the NRO control signal and the RO control signal, which are applied to the respective NRO control signal terminals 104, 124, and to the respective RO control signal terminals 114, 134 of FIG. 4 to control transmission of the signals on the pads 101, 103 through the gate circuits 102, 112, 122, 132 of FIG. 4.

The voltage sensor circuit 180 includes a first inverter 184, the input terminal of which is connected to the bonding-option pad 182. An output terminal of the first inverter 184 is connected to a gate terminal of a shunt NMOS transistor 186 which has its source terminal connected to ground and its drain terminal connected to the bonding-option pad.

If a bonding wire is connected from the bonding-option pad 182 to a VCC voltage terminal, the positive VCC voltage at the input terminal of the inverter 184 is inverted and turns off the shunt NMOS transistor. The voltage at the output terminal of the inverter 184 is inverted by an other inverter 188 to provide a HIGH NRO control signal at its output terminal. Another inverter 192 inverts the NRO signal to provide a RO signal at an output terminal 194.

The bonding-option pad 182 can be held to a LOW state using a bonding wire connected to a VSS, or ground voltage. If the voltage sensor circuit 180 is used and if a bonding wire is not connected to the bonding-option pad 182, insufficient input voltage is available to pull the output terminal of the inverter 184 to ground. The output level of the inverter 184 is HIGH which turns on the shunt NMOS transistor 186, holding the input terminal of inverter 184 at a LOW state. The HIGH voltage level at the output terminal of the inverter 184 is inverted by the other inverter 188 to provide a LOW NRO control signal at an output terminal 190. The inverter 192 inverts the LOW NRO signal to provide a HIGH RO signal at the output terminal 194.

The NRO and RO signals are complementary so that only one can be HIGH while the other must be LOW.

Figure 7:
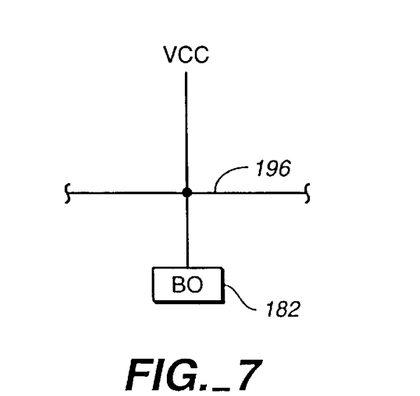
FIG. 7 is a schematic diagram illustrating application of a VCC voltage to a bonding-option pad to provide a standard bonding-pad arrangement, or no-reverse-option NRO, for a reversible-bonding-pad chip according to the invention.

FIG. 7 schematically illustrates application of a VCC voltage to the bonding-option pad 182 located near an edge 196 of the chip to provide a standard bonding-pad arrangement, or no-reverse-option NRO, according to the invention.

Figure 8:
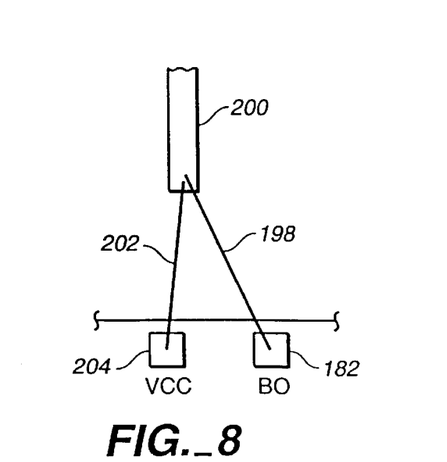
FIG. 8 is a wiring diagram illustrating wire-bond connection made from a lead-frame bonding finger to the bonding-option pad and to the VCC pad to provide a standard bonding-pad arrangement, or no-reverse-option NRO, for a reversible-bonding-pad chip according to the invention.

FIG. 8 illustrates wire-bond connections made with a bonding-wire 198 from a lead-frame bonding finger 200 to the bonding-option pad 182 and with a bonding-wire 202 to a VCC pad 204 on the chip to provide a standard bonding-pad option arrangement, or no-reverse-option NRO, for a chip having one or more pairs of reversible-bonding-pads according to the invention.

Figure 9:
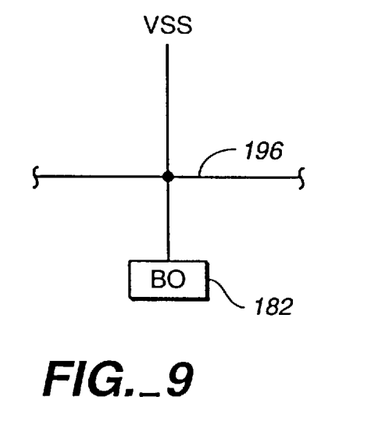
FIG. 9 is a schematic diagram illustrating application of a VSS or ground voltage to a bonding-option pad to provide a non-standard, reversed bonding-pad arrangement RO for a reversible-bonding-pad chip according to the invention.

FIG. 9 schematically illustrates application of a VSS voltage to the bonding-option pad 182 located near an edge 196 of the chip to provide a reverse-option RO, non-standard bonding-pad arrangement according to the invention.

Figure 10:
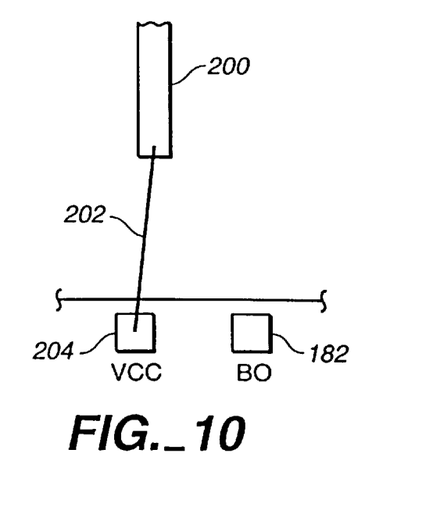
FIG. 10 is a wiring diagram illustrating a wire-bond connection made from a lead-frame bonding finger to the VCC pad and not to the bonding-option pad to provide a reversed bonding-pad arrangement, or reverse-option RO, for a reversible-bonding-pad chip according to the invention.

FIG. 10 illustrates a wire-bond connection made without a bonding-wire from the lead-frame bonding finger 200 to the bonding-option pad 182 and with the bonding-wire 202 to the VCC pad 204 on the chip to provide a non-standard bonding-pad option arrangement, or reverse-option RO, for the chip having one or more pairs of reversible-bonding-pads according to the invention.

FIGS. 6, 7, 8, 9, 10 illustrate that two bonding-pad options are provided with one bonding-option pad 182. A number of other chip options can be provided for a chip or a pair of back-to-back chips. Other chip options include, for example, an inverted chip select CS option and operation of a RAM/ROM chip. FIGS. 11A–B, and FIGS. 12A–C illustrate circuits used for a bonding-pad reversal option using three-bits. A three-bit 011 code applied to three bonding-option pads selects a standard NRO configuration, while a three-bit 100 code applied to the three bonding-option pads selects a non-standard, reversed RO configuration, where the BO3 is the most significant bit.

Figure 11A:
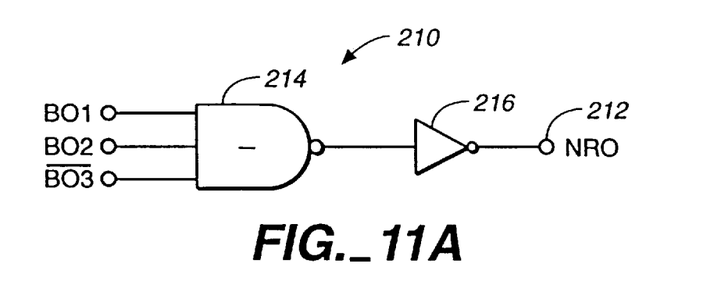
FIG. 11A shows a logic block diagram for a chip with three bonding option pads, which chip uses various bonding option control signals to generate a NRO control signal for a standard non-reversed bonding-pad configuration.

FIG. 11A illustrates a logic circuit 210 for generating a standard NRO gate control signal at an output terminal 212 thereof. A BO1 logic signal, a BO2 logic signal, and a *BO3 logic signal are applied to respective input terminals of a three-input NAND gate 214. When all of these signals are HIGH, a LOW appears at the output terminal of the NAND gate 214. An inverter 216 is connected between the output terminal of the NAND gate 214 and the output terminal 212 to provide a HIGH state for the NRO signal.

Figure 11B:
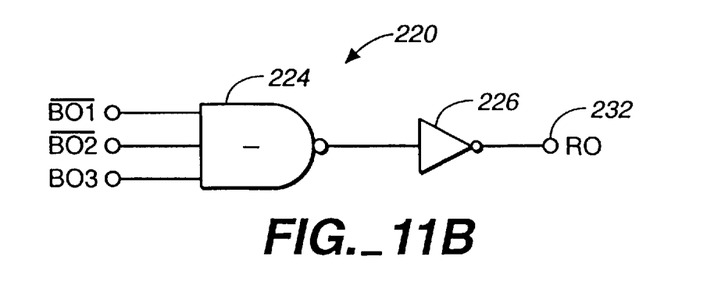
FIG. 11B shows a logic block diagram for the chip with three bonding option pads, which chip uses various ones of the bonding option control signals to generate a RO control signal for a non-standard reversed bonding-pad configuration.

FIG. 11B similarly illustrates a logic circuit 220 for generating a non-standard RO gate control signal at an output terminal 232 thereof. A *BO1 logic signal, a *BO2 logic signal, and a BO3 logic signal are applied to respective input terminals of a three-input NAND gate 224. When all of these signals are HIGH, a LOW appears at the output terminal of the NAND gate 224. An inverter 226 is connected between the output terminal of the NAND gate 224 and the output terminal 232 to provide a HIGH state for the RO signal.

Figure 12A:
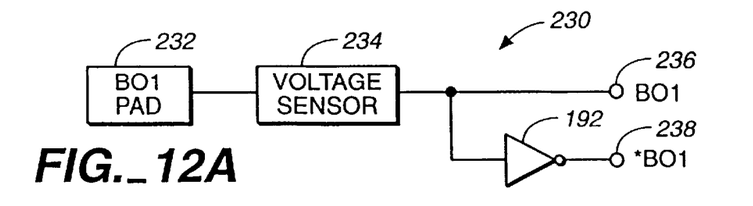
FIGS. 12A, 12B, and 12C show three logic block diagrams which generate three respective pairs of bonding option logic signals BO1/*BO1, BO2/*BO2, and BO3/*BO3, where * denotes an inverted signal.
Figure 13:
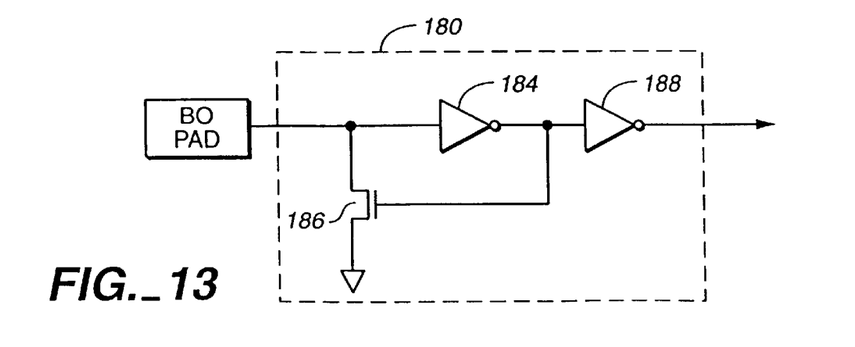
FIG. 13 is a circuit diagram for a bonding-pad voltage sensor circuit.

FIG. 12A, illustrates a logic circuit 230 which generates a pair of bonding option logic signals BO1 and *BO1 which are used in the logic circuits of FIGS. 11A and 11B. A first bonding-option BO1 pad 232 is connected to an input terminal of a voltage sensor circuit 234, which is illustrated in FIG. 13 and which is similar to the voltage sensor circuit 180 of FIG. 6, wherein like reference numerals are used for like elements. The pair of bonding option logic signals BO1 and *BO1 are provided at respective output terminals 236, 238.

Figure 12B:
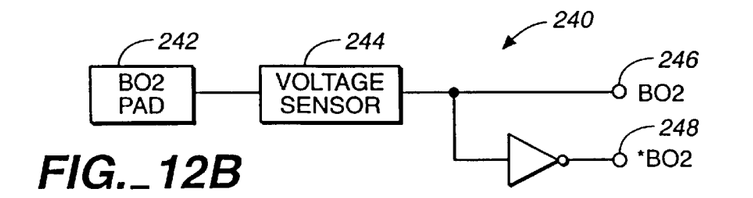

FIG. 12B illustrates a logic circuit 240 which generates a pair of bonding option logic signals BO2 and *BO2 which are also used in the logic circuits of FIGS. 11A and 11B. A second bonding-option pad BO2 pad 242 is connected to an input terminal of a voltage sensor circuit 244, which is illustrated in FIG. 13 and which is similar to the voltage sensor circuit 180 of FIG. 6, wherein like reference numerals are used for like elements. The pair of bonding option logic signals BO2 and *BO2 are provided at respective output terminals 246, 248.

Figure 12C:
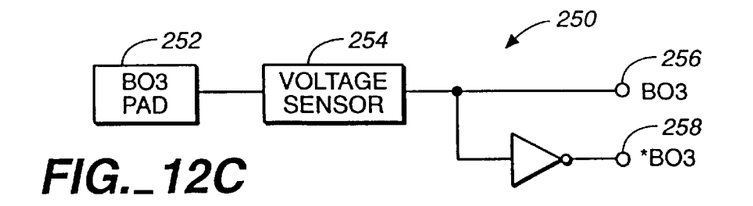

FIG. 12C illustrates a logic circuits 250 which generates a pair of bonding option logic signals BO2 and *BO2 which are also used in the logic circuits of FIGS. 11A and 11B. A third bonding-option pad BO2 pad 252 is connected to an input terminal of a voltage sensor circuit 254, which is illustrated in FIG. 13 and which is similar to the voltage sensor circuit 180 of FIG. 6, wherein like reference numerals are used for like elements. The pair of bonding option logic signals BO3 and *BO3 are provided at respective output terminals 256, 258.

Figure 14:
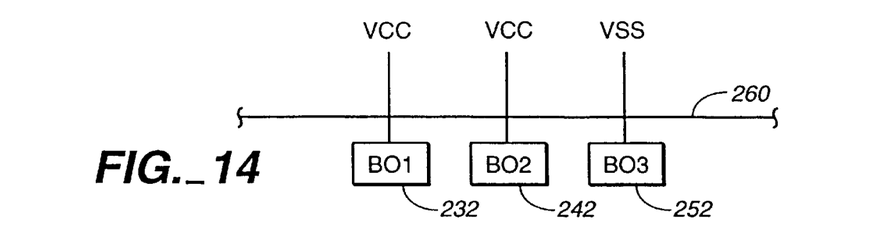
FIG. 14 is a schematic diagram illustrating connections made to three bonding-option control pads to provide a standard bonding-pad arrangement, or no-reverse-option NRO, for a reversible-bonding-pad chip according to the invention.

FIG. 14 schematically illustrates application of a VCC voltage to the BO1 bonding-option pad 232 and application of a VCC voltage to the BO2 bonding-option pad 242 and VSS to the BO3 bonding-option pad 252, all located near an edge 260 of a chip to provide a standard bonding-pad arrangement, or no-reverse-option NRO, according to the invention, using a code 011.

Figure 15:
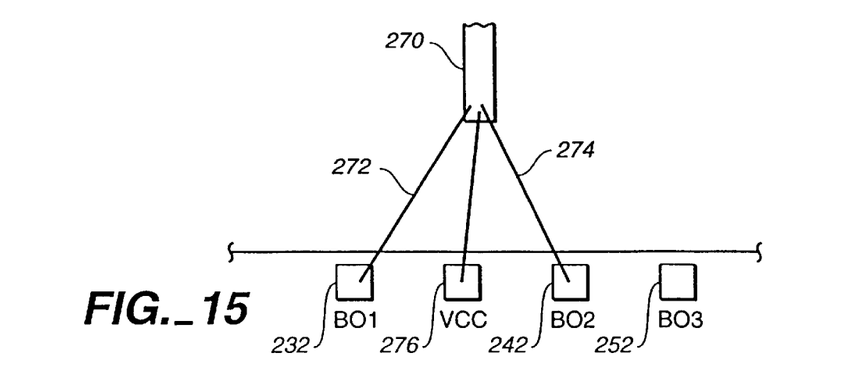
FIG. 15 is a wiring diagram illustrating connections made between a VCC bonding finger and two bonding-option control pads BO2 and BO3 to provide the standard bonding-pad arrangement NRO, for a reversible-bonding-pad chip according to the invention.

FIG. 15 illustrates NRO wire-bond connections made with bonding-wires 272, 274 from a lead-frame bonding finger 270 to bonding-option pads 232, 242 with respective bonding-wires 272, 274 connected to a VCC pad 276 on the chip to provide a standard bonding-pad option arrangement for a chip having one or more pairs of reversible-bonding-pads according to the invention.

Figure 16:
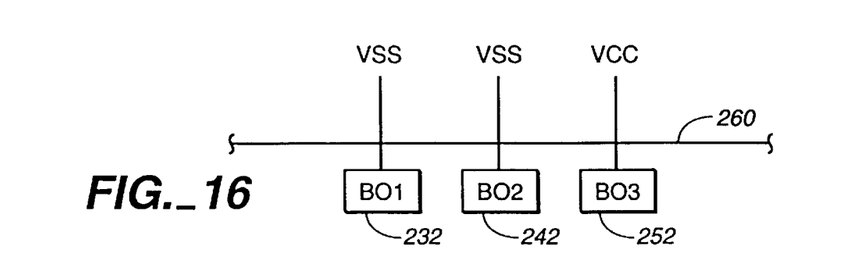
FIG. 16 is a schematic diagram illustrating connections made to the three bonding-option control pads to provide a reverse bonding-pad arrangement, or reverse-option RO, for a reversible-bonding-pad chip according to the invention.

FIG. 16 schematically illustrates application of a VSS voltage to the BO1 bonding-option pad 232 and application of a VSS voltage to the BO2 bonding-option pad 242, and VCC to the BO3 bonding-option pad 252, all located near an edge 260 of a chip to provide a non-standard bonding-pad arrangement, or reverse-option RO, according to the invention, using a code 001.

Figure 17:
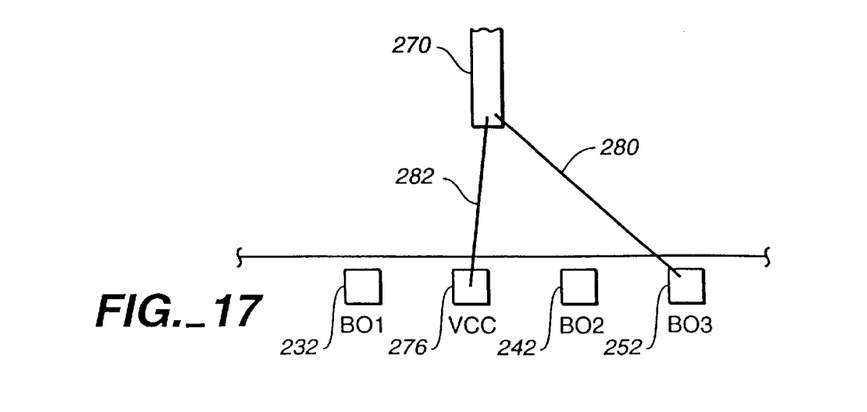
FIG. 17 is a wiring diagram illustrating connections made between the VCC bonding finger and one of the three bonding-option control pads BO1 to provide the reverse bonding-pad arrangement RO for a reversible-bonding-pad chip according to the invention.

FIG. 17 illustrates wire bond connections made with bonding wire 280 from a lead frame bonding finger 270 to bonding option pad 252. Bonding wire 282 connects the VCC finger 270 to the VCC pad 276. This arrangement provides a non-standard, reverse bonding-pad option RO for a chip having one or more pairs of reversible bonding pads according to the invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An integrated-circuit chip having one or more pairs of reversible wire-bonding-pads to alternatively provide a standard pattern for the reversible wire-bonding-pads and a non-standard, reversed wire-bonding pattern for the reversible wire-bonding-pads, comprising:

a first wire-bonding-pad;

a second wire-bonding-pad;

a first common signal line on said integrated-circuit chip;

a second common signal line on said integrated-circuit chip;

a first gate circuit having an input signal terminal connected to the first wire-bonding-pad, having an output signal terminal connected to the first common signal line, and having a control terminal which receives a standard wire-bonding configuration control signal which operates the first gate circuit to provide a standard pattern for the first wire-bonding-pad, which standard pattern connects the first wire-bonding-pad to the first common signal line to thereby provide the first input LOGIC signal to the first common signal line on said integrated-circuit chip;

a second gate circuit having an input signal terminal also connected to the first wire-bonding-pad, having an output signal terminal connected to the second common signal line, and having a control terminal which receives a non-standard, reversed wire-bonding configuration control signal which operates the second gate circuit to alternatively provide a non-standard, reversed pattern for the first wire-bonding-pad, which non-standard, reversed pattern connects the first wire-bonding-pad to the second common signal line to thereby alternatively provide the first input LOGIC signal to the second common signal line on said integrated-circuit chip;

a third gate circuit having an input signal terminal connected to the second wire-bonding-pad, having an output signal terminal connected to the second common signal line, and having a control terminal which receives the standard wire-bonding configuration control signal which operates the third gate circuit to provide a standard pattern for the second wire-bonding-pad, which standard pattern connects the second wire-bonding-pad to the second common signal line to thereby provide the second input LOGIC signal to the second common signal line on said integrated-circuit chip;

a fourth gate circuit having an input signal terminal also connected to the second wire-bonding-pad, having an output signal terminal connected to the first common signal line, and having a control terminal which receives the non-standard, reversed wire-bonding configuration control signal which operates the fourth gate circuit to alternatively provide a non-standard, reversed pattern for the second wire-bonding-pad, which non-standard, reversed pattern connects the second wire-bonding-pad to the first common signal line to thereby alternatively provide the second input LOGIC signal to the first common signal line on said integrated-circuit chip;

wherein the first gate circuit and the third gate circuit are controlled by the standard-bonding-pad control signal to provide a predetermined standard bonding-pad configuration for the integrated-circuit chip, which standard bonding-pad configuration connects the first wire-bonding input pad to the first common signal line on the integrated-circuit chip and which standard bonding-pad configuration also connects the second wire-bonding-pad to the second common signal line; and whereby the second gate circuit and the fourth gate circuit are controlled by the reverse-bonding-pad control signal to provide a predetermined alternative reversed bonding-pad configuration for the integrated-circuit chip, which alternative reversed bonding-pad configuration connects the first wire-bonding-pad to the second common signal line and which alternative reversed bonding-pad configuration also connects the second wire-bonding-pad to first common signal line.

2. The integrated-circuit chip of claim 1, including a plurality of pairs of first and second wire-bonding-pads;

a plurality of pairs of first and second common signal lines which are associated with one of said first and second wire bonding-pads;

a plurality of pairs of first and second gate circuits which are associated with one of said first and second wire bonding-pads;

a plurality of pairs of third and fourth gate circuits which are associated with one of said first and second wire bonding-pads; and wherein each of said plurality of pairs of first and second wire-bonding-pads provides a standard pattern and a non-standard, reversed pattern for each of said plurality of pairs of wire-bonding-pads for the integrated-circuit chip.

3. The integrated-circuit chip of claim 1, including a bonding-option wire-bonding-pad adapted to having an external voltage applied thereto to indicate whether the integrated-circuit chip is to provide a standard pattern for the reversible wire-bonding-pads, or alternatively, wither the integrated-circuit chip is to provide a reversed path for the reversible wire-bonding-pads;

a voltage sensor circuit for sensing the voltage applied to the bonding-option wire-bonding-pad and for alternatively generating either a standard NRO gate control signal or a non-standard, reversed RO gate control signal from the voltage state of the bonding-option wire-bonding-pad.

4. The integrated-circuit chip of claim 3, including two or more bonding-option wire-bonding-pads, each of which are adapted to having an external voltage applied thereto;

one or more voltage sensor circuits for respectively sensing the voltage applied to a respective bonding-option wire-bonding-pad;

a bonding option logic signal array for generating one or more bonding option logic signals; and a logic circuit for generating standard NRO and non-standard, reversed RO gate control signals from the one or more bonding option logic signals.

5. The integrated-circuit chip of claim 4, including three bonding-option wire-bonding-pads which are adapted to having an external voltage applied thereto such that the logic circuit for generating standard NRO and non-standard, reversed RO gate control signals generates the standard NRO and non-standard, reversed RO gate control signals.

6. The integrated-circuit chip of claim 1 wherein the gate circuits includes a logic circuit which has a first signal input terminal connected to one of the wire-bonding-pads, which has a second control signal input terminal which receives a wire-bonding configuration control signal to operate the gate circuit, and which has an output terminal coupled to one of the common signal lines.

7. The integrated-circuit chip of claim 6 wherein the gate circuits include a chip enable input terminal for receiving a chip enable signal CE to activate the gate circuits.

8. The integrated-circuit chip of claim 6:

wherein the logic circuit includes a first logic gate, having an input terminal connected to a first signal input terminal, having a second input terminal connected to the second control signal input terminal, and having an output terminal connected to an input terminal of the output driver circuit; and wherein the logic circuit includes a second logic gate, having an input terminal connected through an inverter to the first signal input terminal, having a second input terminal connected through an inverter to the second control signal input terminal, and having an output terminal connected to an input terminal of the output driver circuit.

9. The integrated-circuit chip of claim 8 wherein the first logic gate includes a NAND gate and wherein the second logic gate includes a NOR gate.

10. The integrated-circuit chip of claim 9 wherein the first logic gate has an input terminal for receiving a chip enable signal CE and wherein the second logic gate has an input terminal for receiving an inverted chip enable signal.

11. The integrated-circuit chip of claim 9 wherein the logic circuit includes an output driver circuit having an input terminal and having an output terminal connected to one of the common signal lines.

12. The integrated-circuit chip of claim 11 wherein the output driver circuit includes a complementary-transistor output amplifier.

13. The integrated-circuit chip of claim 12 wherein the complementary transistor amplifier includes a p-channel transistor having a gate terminal connected to an output terminal of the NAND gate and a N-channel transistor connected to an output terminal of the NOR gate.

14. The integrated-circuit chip of claim 1 wherein the first and the second wire-bonding-pads are adapted to be connected to external control signals for the integrated-circuit chip.

* * * * *